United States Patent
Pao

(10) Patent No.: US 6,470,962 B1
(45) Date of Patent: Oct. 29, 2002

(54) RETAINING TOOL OF HEAT RADIATOR

(75) Inventor: Chung Hua Pao, Yungho (TW)

(73) Assignee: Infortrend Technology Inc., Chungho (TW)

( * ) Notice: Subject to any disclaimer, the term of this patent is extended or adjusted under 35 U.S.C. 154(b) by 30 days.

(21) Appl. No.: 09/935,838

(22) Filed: Aug. 24, 2001

(51) Int. Cl.⁷ .............................................. H05K 7/20
(52) U.S. Cl. ..................... 165/80.3; 165/185; 174/16.3; 257/719; 361/704
(58) Field of Search ................................ 165/80.3, 185; 174/16.3; 257/718, 719, 722; 361/704

(56) References Cited

U.S. PATENT DOCUMENTS

| | | | | |
|---|---|---|---|---|
| 5,353,863 A | * | 10/1994 | Yu | ............................. 165/80.3 |
| 5,621,244 A | * | 4/1997 | Lin | ............................. 257/722 |
| 5,881,800 A | * | 3/1999 | Chung | ........................ 165/185 |
| 6,161,611 A | * | 12/2000 | Cheng | ........................ 165/185 |
| 6,246,584 B1 | * | 6/2001 | Lee et al. | ................... 361/704 |

* cited by examiner

Primary Examiner—Leonard Leo

(57) ABSTRACT

The present invention provides an improved retaining tool of heat radiator comprising a heat radiator and two retaining tools. Slide grooves are disposed at two opposite sides of the heat radiator. The slide grooves can join the two integrally formed retaining tools. A first hook board, a long board body, and a second hook board are formed on each of the two retaining tools. The first hook boards and the second hook boards can be hooked and joined at the bottom of a heat-emitting element (e.g., a chip or a CPU) of a motherboard. Each of the long board bodies has two protuberances and two resilient sheets to effectively prevent the retaining tools from detaching when being joined in the slide grooves at the two sides of the heat radiator.

5 Claims, 6 Drawing Sheets

US 6,470,962 B1

RETAINING TOOL OF HEAT RADIATOR

FIELD OF THE INVENTION

The present invention relates to an improved retaining tool of heat radiator and, more particularly, to an improved retaining tool capable of shrinking the volumes of electronic apparatuses such as computer mainframes to let them be more portable, thereby enhancing competitive capability in market.

BACKGROUND OF THE INVENTION

Along with progress of scientific technology, the processing speed of electronic apparatuses such as computer mainframes, personal digital assistants (PDAs), and so on become faster and faster, and heat generated therein also becomes more and more. In order to effectively radiate the heat generated in the electronic apparatuses out of the system so that each element therein can operate under admissible temperatures, heat radiators have become indispensable accessories. A retaining tool must be used to join a heat radiator and a heat-emitting element (e.g., a chip or a central processing unit (CPU)) on a motherboard in an electronic apparatus so that the heat radiator can be firmly positioned on the heat-emitting element to help the heat-emitting element radiate out heat, thereby letting the electronic apparatus operate normally.

As shown in FIGS. 1 and 2, a heat radiator 10 is integrally formed of metal. Two projective lugs 101 extend from an upper end and a lower end at two sides of the heat radiator 10, respectively. A cavity 102 is formed on each of the two projective lugs 101.

Two retaining tools 11 are also provided. A head portion 111 and a barb portion 112 are disposed at an upper end and a lower end of each of the retaining tools 11, respectively (as shown in FIG. 2). Each of the retaining tools 11 can be sleeved into a spring 12. The retaining tools 11 can be inserted into the cavities 102 of the projective lugs 101 extending from the heat radiator 10 so that the barb portions 112 at the lower ends of the retaining tools 11 can be joined in pre-reserved holes 131 on a motherboard 13. The retaining tools 11 are used to position the heat radiator 10 on a heat-emitting element 132 of the motherboard 13, hence helping the heat-emitting element 132 radiate out heat.

Because the barb portions 112 of the retaining tools 11 are joined in the pre-reserved holes 131 of the motherboard 11, the projective lugs 101 must extend from two sides of the heat radiator 10 so that the heat radiator 10 can be positioned on the heat-emitting element 132 on the motherboard 13. However, electronic apparatuses tend to be compact nowadays. Under the restriction of limited space, the projective lugs 101 of the heat radiator 10 will occupy more space and hinder the disposition of other elements and the circuit layout on the motherboard 13, hence letting the electronic apparatuses not conform to the trend of compactness and generating the trouble of bad portability.

Moreover, because the heat radiator 10 is fixed in the pre-reserved holes 131 of the motherboard 13, the disposition of the pre-reserved holes 131 must be very accurate to facilitate insertion of the retaining tools 11. Therefore, the pre-reserved holes 131 must be drilled in the motherboard 13, hence reducing production and assembly speed and increasing the production cost.

Accordingly, the above heat radiator and retaining structure have inconvenience and drawbacks in practical installation or use. The present invention aims to resolve the problems in the prior art.

SUMMARY OF THE INVENTION

The primary object of the present invention is to provide an improved retaining tool of heat radiator to effectively save the space, avoid hindering disposition of other elements and circuit layout on a motherboard, shrink the volumes of electronic apparatuses to let them conform to the trend of compactness, hence achieving good portability and enhancing competitive capability in market.

Another object of the present invention is to provide an improved retaining tool of heat radiator, whereby a heat radiator and a heat-emitting element can be joined without the need of disposing pre-reserved holes on a motherboard, hence facilitating installation of the heat radiator, enhancing the throughput, and reducing the production cost.

To achieve the above objects, the present invention provides an improved retaining tool of heat radiator comprising a heat radiator and two retaining tools. Two slide grooves are disposed at two opposite sides of the heat radiator, respectively. The slide grooves can be used to join the two retaining tools at two sides of the heat radiator. A first hook board and a long board body are formed on each of the retaining tools. One side of the long board body forms a second hook board. The first hook board and the second hook board can be hooked and joined at the bottom of a heat-emitting element of a motherboard. An inverse U-shaped groove is disposed at a side of the second hook board. A tool (e.g., a screwdriver) can be inserted into the inverse U-shaped groove so that the retaining tools can be wrenched to separate the retaining tools from the heat-emitting element.

The various objects and advantages of the present invention will be more readily understood from the following detailed description when read in conjunction with the appended drawing, in which:

DETAILED DESCRIPTION OF THE PREFERRED EMBODIMENTS

Figure 1:
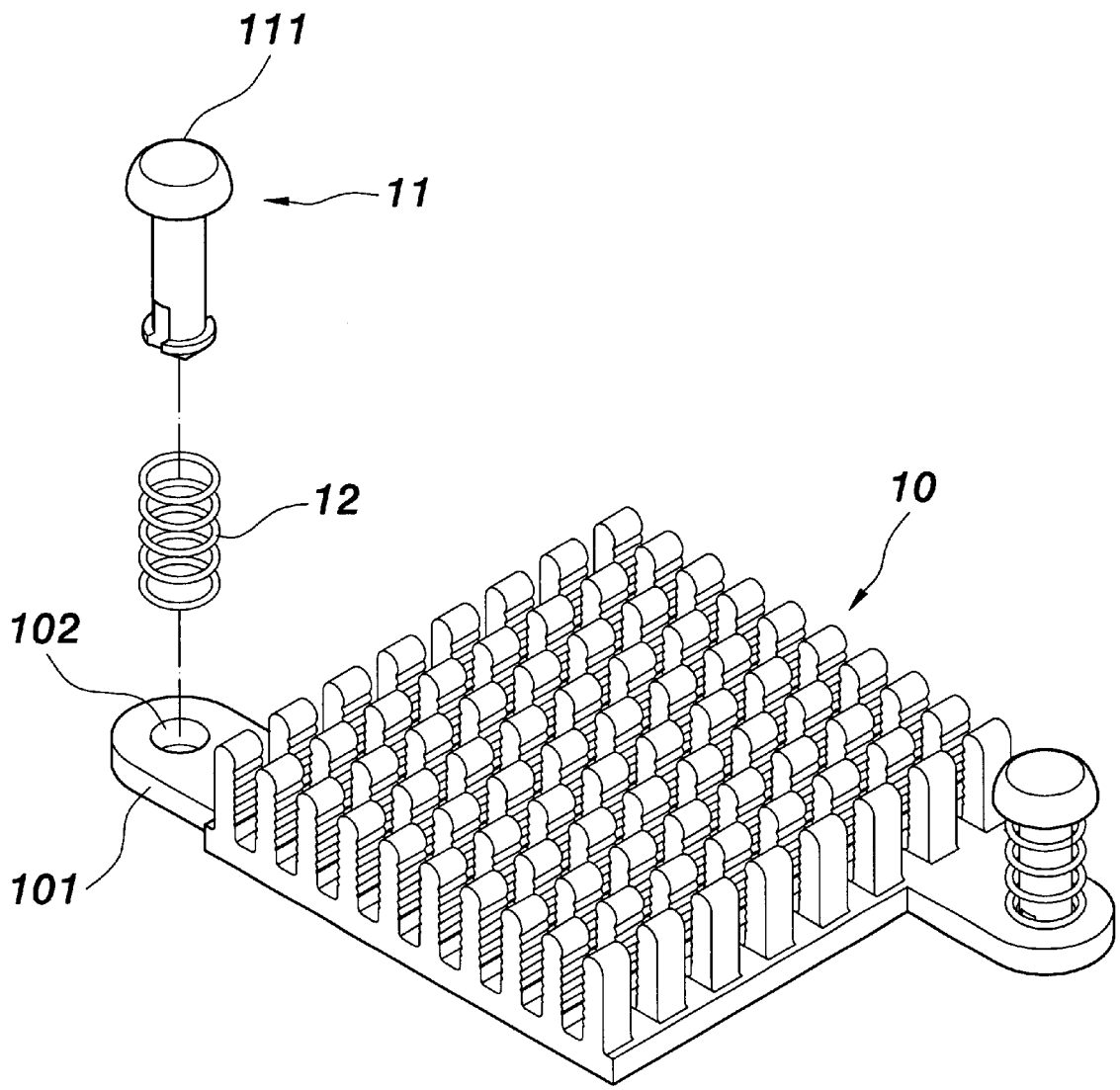
FIG. 1 is an exploded perspective view of a heat radiator and retaining tools in the prior art.
Figure 2:
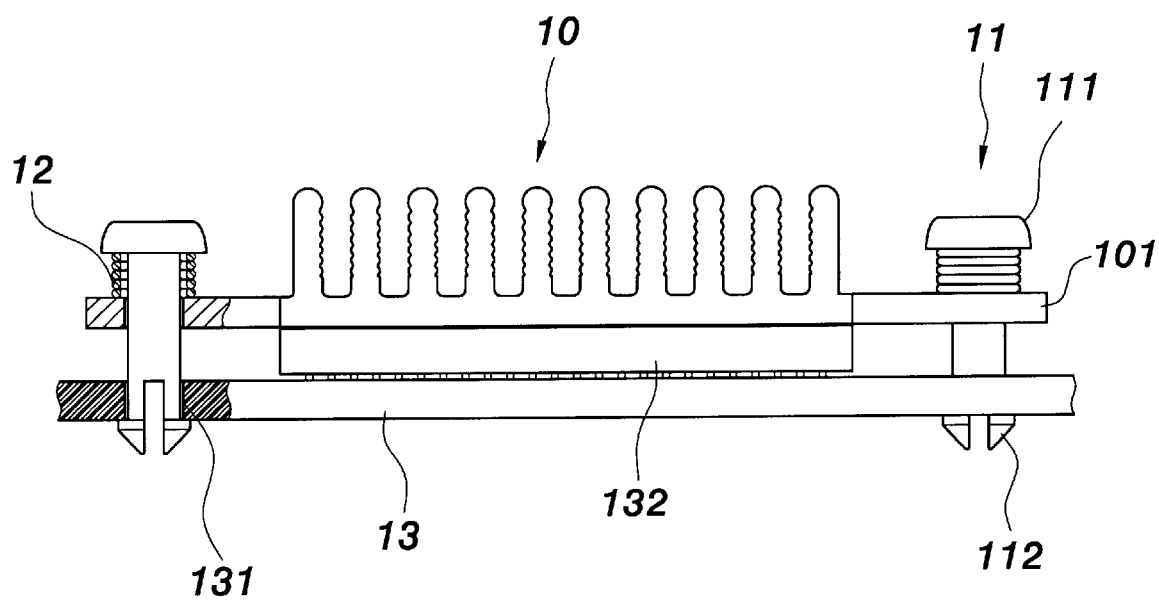
FIG. 2 is a cross-sectional view of a heat radiator and retaining tools in the prior art.
Figure 3:
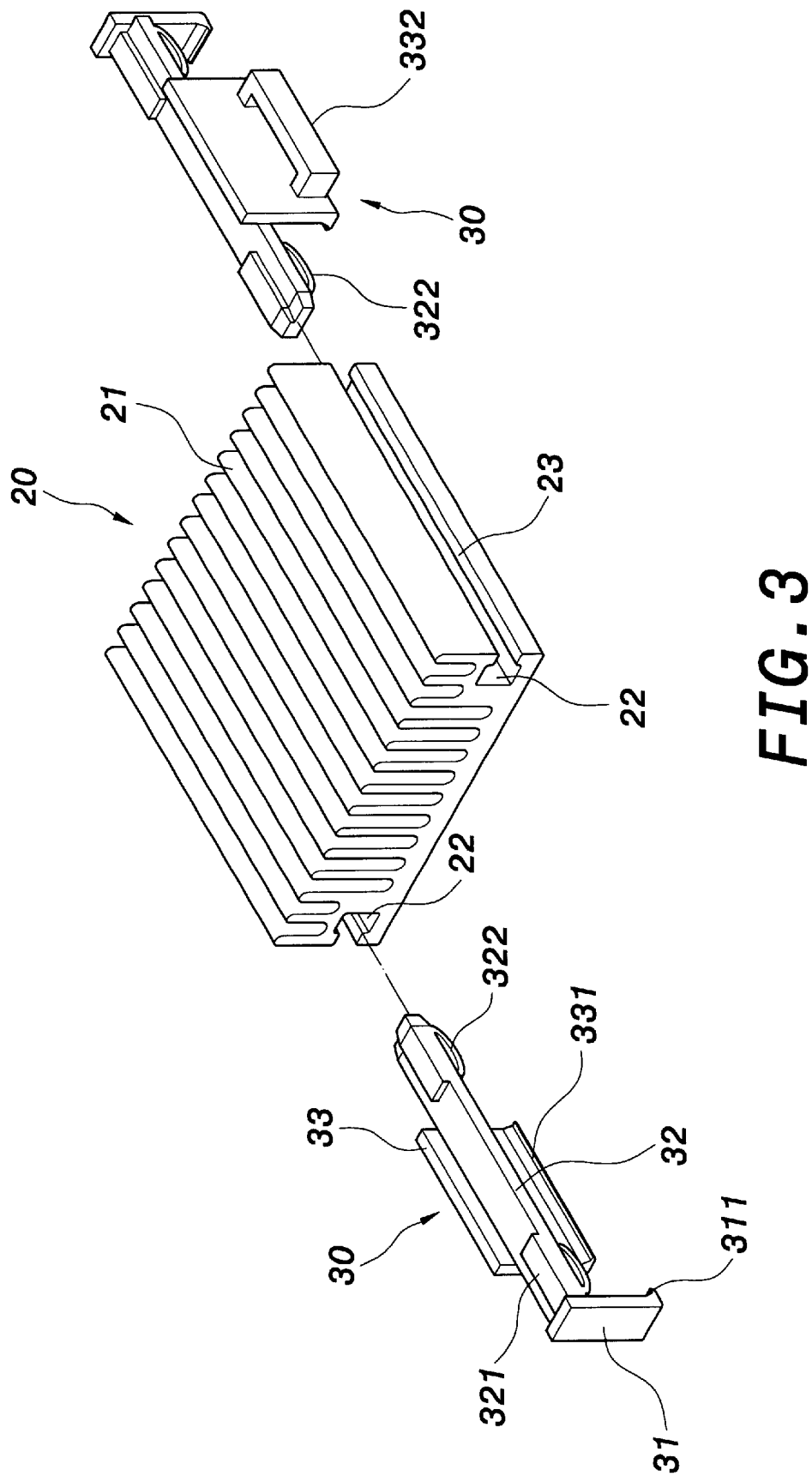
FIG. 3 is an exploded perspective view of the present invention.

As shown in FIG. 3, the present invention relates to an improved retaining tool of heat radiator and, more particularly, to an improved retaining tool capable of shrinking the volumes of electronic apparatuses such as computer mainframes to let them be more portable, thereby enhancing competitive capability in market. The improved retaining tool of heat radiator of the present invention comprises a heat radiator 20 and two retaining tools 30.

The heat radiator 20 is integrally formed of metallic material having good heat conductance such as aluminum or copper. A plurality of heat-radiating fins 21 are formed on the heat radiator 20. The heat-radiating fins 21 are used to increase heat-emitting area and provide fast heat-radiating effect. The above structure is the same as that in the prior art and thus will not be further described.

Figure 4:
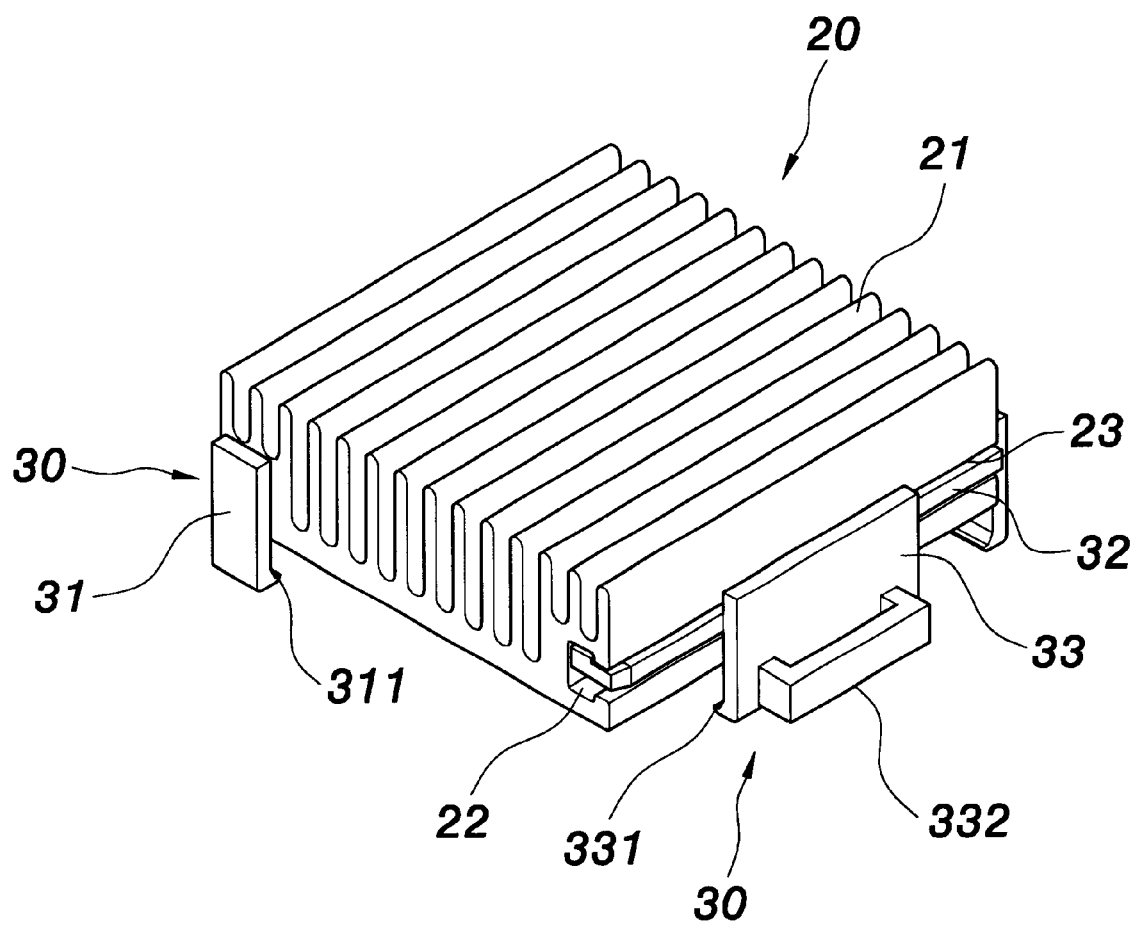
FIG. 4 is a perspective view of the present invention.
Figure 5:
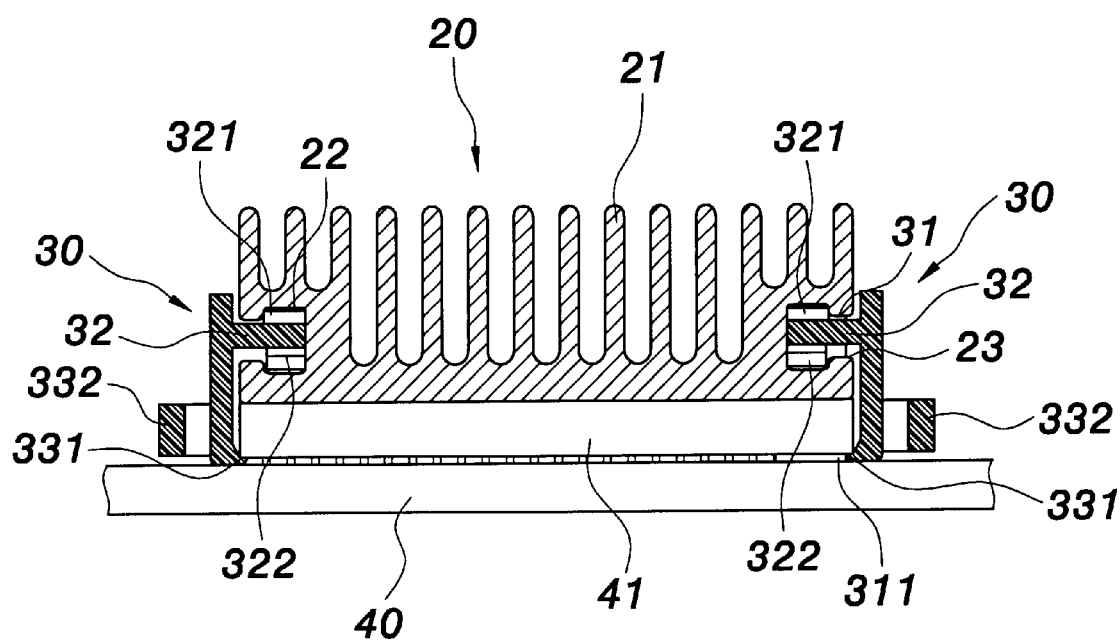
FIG. 5 is a cross-sectional view of the use state of the present invention.

As shown in FIGS. 3, 4, and 5, two slide grooves 22 are disposed at two opposite sides of the heat radiator 20, respectively. Front and rear ends of the slide grooves 22 penetrate through the heat radiator 20. An opening 23 is formed at the outside of each of the slide grooves 22. The insides of the slide grooves 22 are roughly upper-narrow lower-wide shapes so that the opening 23 has a size narrower than that of the slide grooves 22.

The retaining tools 30 are integrally formed of plastic material. The length of the retaining tools 30 is approximately equal to the side length of the heat radiator 20. A first hook board 31 and a long board body 32 are formed on each of the retaining tools 30. A second hook board 33 is formed at a side of the long board body 32. A first hook portion 311 is formed at the lower portion of the first hook board 31. An inverse U-shaped groove 332 is formed at the outside of the second hook board 33. A second hook portion 331 is also formed at the lower portion of the second hook board 33. The long board bodies 32 can be inserted into the slide grooves 22 of the heat radiator 22. The first hook boards 31 abut against the outer edges of the heat radiator 20 so that the retaining tools 20 can be joined at two sides of the heat radiator 20, as shown in FIG. 4.

Two protuberances 321 are disposed near the inside on the top face of the long board body 32. Two roughly arc-shaped resilient sheets 322 are disposed near the inside on the bottom face of the long board body 32. The two protuberances 321 can match the slide grooves 22 with insides of roughly upper-narrow lower-wide shapes. The resilient sheets 322 are integrally joined on the bottom face of the long board body 32. The two protuberances 321 and the two resilient sheets 322 are matched in the slide grooves 22 to prevent the retaining tools 30 from detaching when being joined in the slide grooves 22 at two sides of the heat radiator 20.

Figure 6:
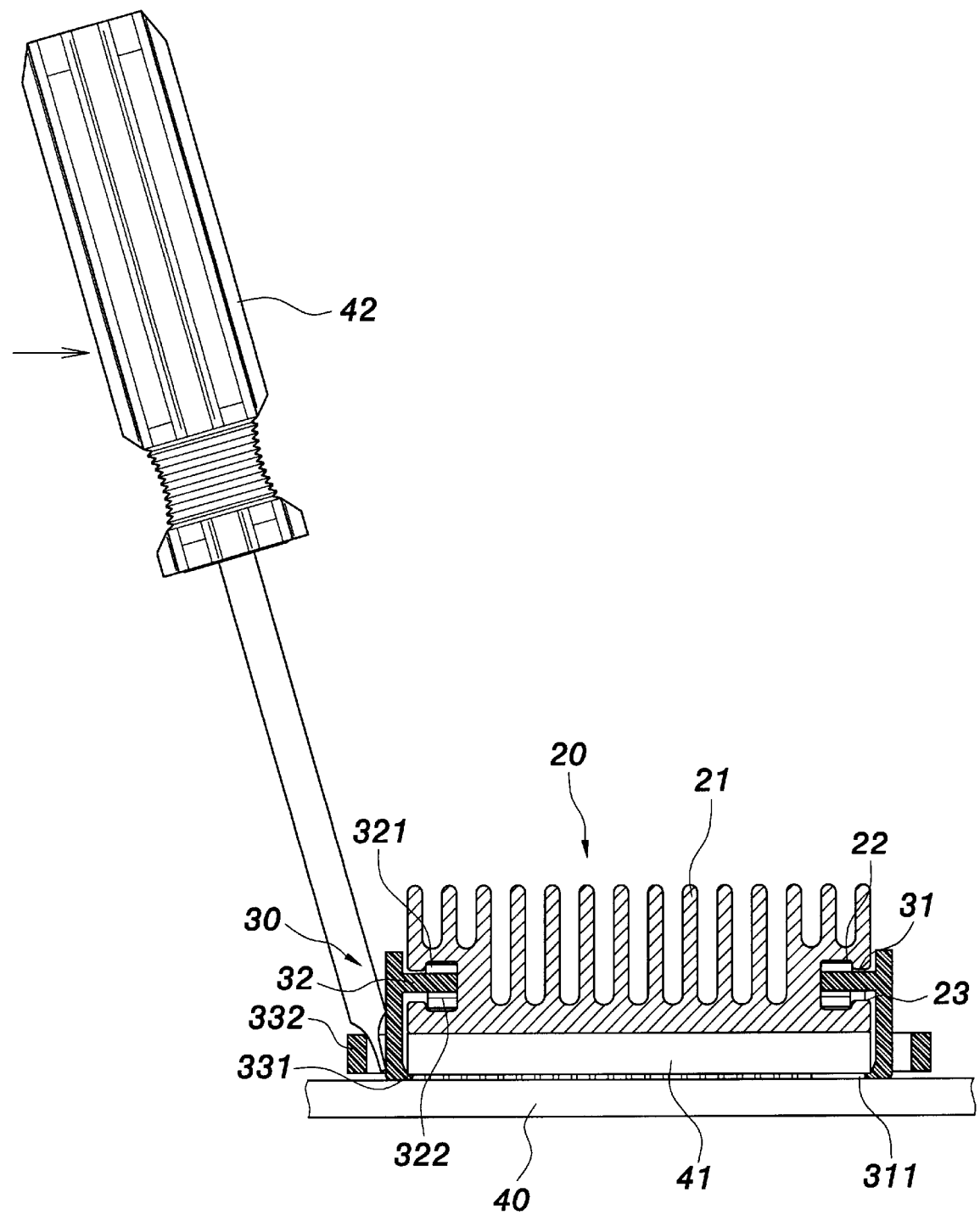
FIG. 6 is another cross-sectional view of the use state of the present invention.

As shown in FIGS. 4, 5, and 6, the first hook portion 311 of the first hook board 31 and the second hook portion 331 of the second hook board 33 can be hooked and joined at the bottom of a heat-emitting element 41 (e.g., a chip or a CPU) of a motherboard 40 (as shown in FIG. 5). Therefore, the heat radiator 20 10 and the two retaining tools 30 can be joined with the heat-emitting element 41. A tool 42 (e.g., a screwdriver) can be inserted into the inverse U-shaped groove 332 of the second hook board 33 (as shown in FIG. 6) for wrenching the second hook portion 331 of the retaining tool 30 to move outwards, hence separating the retaining tool 30 from the heat-emitting element 41.

To sum up, in the present invention, the two slide grooves 22 are disposed at two opposite sides of the heat radiator 20 to join the two retaining tools 30, and the first hook boards 31, the long board bodies 32, the second hook boards 33, and the inverse U-shaped grooves 332 are formed on the retaining tools 30 to firmly join the heat radiator 20 and the retaining tools 30 or to separate them. Therefore, projective lugs extending from two sides of the heat radiator 20 and occupying much space can be saved. Moreover, it is not necessary to dispose pre-reserved holes on the motherboard 40, hence reducing the production cost.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. An improved retaining tool of heat radiator, comprising:

a heat radiator with slide grooves disposed at two opposite sides thereof, an opening being formed at an outside of each of said slide grooves; and two integrally formed retaining tools, a first hook board and a long board body being formed on each of said retaining tools, a second hook board being formed at a side of said long board body, hook portions being formed at lower portions of said first hook board and said second hook board, said long board bodies of said retaining tools being inserted into said slide grooves at the two sides of said heat radiator so that said two retaining tools can be joined with said heat radiator, said hook portions of said first hook boards and said second hook boards being joined at a bottom of a heat-emitting element of a motherboard through joint of said heat radiator and said retaining tools.

2. The improved retaining tool of heat radiator as claimed in claim 1, wherein said heat radiator is integrally formed of metallic material having good heat conductance such as aluminum or copper.

3. The improved retaining tool of heat radiator as claimed in claim 1, wherein front and rear ends of said slide grooves of said heat radiator penetrate through said heat radiator.

4. The improved retaining tool of heat radiator as claimed in claim 1, wherein two protuberances and two resilient sheets are respectively disposed near insides of a top face and a bottom face of said long board body of each of said two retaining tools, and said protuberances and said resilient sheets are matched in said slide grooves.

5. The improved retaining tool of heat radiator as claimed in claim 1, wherein an inverse U-shaped groove is formed on said second hook board of each of said two retaining tools.

* * * * *